United States Patent
Greschitz et al.

(10) Patent No.: US 7,027,625 B2
(45) Date of Patent: Apr. 11, 2006

(54) FINGERPRINT SENSOR WITH POTENTIAL MODULATION OF THE ESD PROTECTIVE GRATING

(75) Inventors: Manfred Greschitz, Graz (AT); Gerhard Hierz, Graz (AT); Albert Scheucher, St. Veit/Vogau (AT); Franz Wolf, Graz (AT)

(73) Assignee: Infineon Technologies AG, Munich (DE)

( * ) Notice: Subject to any disclaimer, the term of this patent is extended or adjusted under 35 U.S.C. 154(b) by 14 days.

(21) Appl. No.: 10/657,603

(22) Filed: Sep. 8, 2003

(65) Prior Publication Data

US 2004/0156538 A1    Aug. 12, 2004

Related U.S. Application Data

(63) Continuation of application No. PCT/DE02/00690, filed on Feb. 26, 2002.

(30) Foreign Application Priority Data

Mar. 6, 2001  (DE) .................... 101 10 724

(51) Int. Cl.
*G06K 9/00*    (2006.01)
*B42D 15/00*  (2006.01)

(52) U.S. Cl. .................... 382/124; 283/68; 283/69; 283/70; 283/78

(58) Field of Classification Search ........ 382/124–127; 396/15; 427/1; 283/68–70, 78; 324/661
See application file for complete search history.

(56) References Cited

U.S. PATENT DOCUMENTS 5,325,442 A * 6/1994 Knapp ................. 382/124
6,055,324 A    4/2000 Fujieda (Continued)

FOREIGN PATENT DOCUMENTS

DE    198 44 145 A1    1/2000
DE    198 36 770 C1    4/2000

(Continued)

OTHER PUBLICATIONS

Inglis, D. et al.: "SA 17.7: A Robust 1.8V 250µW Direct-Contact 500dpi Fingerprint Sensor", IEEE International Solid-State Circuits Conference, 1998, pp. 284-285.

*Primary Examiner*—Samir Ahmed
*Assistant Examiner*—Brian Le
(74) *Attorney, Agent, or Firm*—Laurence A. Greenberg; Werner H. Stemer; Ralph E. Locher

(57) ABSTRACT

The invention relates to fingerprint sensors. A fingerprint sensor has a plurality of sensor electrodes below a surface intended for contacting the underside of a finger. At least one protective electrode is mounted on the surface. The sensor electrodes can have a first AC voltage at a prescribed frequency applied to them. The protective electrode can have a second AC voltage, which is essentially at the prescribed frequency, applied to it.

14 Claims, 1 Drawing Sheet

U.S. PATENT DOCUMENTS

| | | |
|---|---|---|
| 6,069,970 A | 5/2000 | Salatino et al. |
| 6,088,471 A * | 7/2000 | Setlak et al. ............... 382/124 |
| 6,259,804 B1 * | 7/2001 | Setlak et al. ............... 382/124 |
| 6,343,140 B1 * | 1/2002 | Brooks ...................... 382/115 |
| 6,512,381 B1 * | 1/2003 | Kramer ...................... 324/658 |
| 6,647,133 B1 * | 11/2003 | Morita et al. ............... 382/124 |
| 2001/0022337 A1 | 9/2001 | Basse et al. |
| 2002/0066942 A1 | 6/2002 | Opolka et al. |

FOREIGN PATENT DOCUMENTS

| | | |
|---|---|---|
| DE | 199 01 384 A1 | 7/2000 |
| EP | 0 902 387 A2 | 3/1999 |
| EP | 1 059 602 A1 | 12/2000 |
| JP | 08305832 A | 11/1996 |
| WO | 00/10205 | 2/2000 |
| WO | 00/42657 | 7/2000 |

* cited by examiner

FINGERPRINT SENSOR WITH POTENTIAL MODULATION OF THE ESD PROTECTIVE GRATING

CROSS-REFERENCE TO RELATED APPLICATION

This application is a continuation of copending International Application No. PCT/DE02/00690, filed Feb. 26, 2002, which designated the United States and was not published in English.

BACKGROUND OF THE INVENTION

Field of the Invention

The invention relates generally to sensors used for recording fingerprints. In particular, the invention relates to an apparatus for protecting against ESD (Electrostatic Discharge) for such fingerprint sensors.

Every person has biological features with characteristics that are permanent from birth and that can be uniquely associated with the person to whom they belong. One of these biological features is fingerprints. Fingerprints have papillary lines with patterns including arcs, whirls and loops. The characteristics of these patterns are always unique. Hence, equipment intended for establishing the identity of a person frequently use the characteristics of a fingerprint to identify the person in question. Such equipment can be used in a wide variety of ways. Security systems based recognizing fingerprints are useful devices for protecting against misuse, particularly in the fields of e-commerce and electronic banking or at entrances to areas of buildings.

To record a fingerprint, capacitive fingerprint sensors are usually used. Such fingerprint sensors have a contact surface with an underlying matrix including a large number of individual sensor electrodes. The sensor electrodes have an AC voltage applied to them. As soon as a finger is placed in the vicinity of the matrix, electrostatic capacitances arise between the underside of the finger and the sensor electrodes to which the AC voltage is applied. The different dielectric constants of the papillary lines and the grooves in the fingerprints can then be used to distinguish between the papillary lines and the grooves. This allows the fingerprints to be represented in two dimensions. Such fingerprint sensors are known from Japanese Patent Application JP 8 305 832 A and from U.S. Pat. No. 6,055,324, which are herein incorporated by reference. In particular, these documents explain the function of the AC voltage applied to the sensor electrodes.

With fingerprint sensors, the intention is for the finger whose print needs to be recorded to directly touch the contact surface of the fingerprint sensor. When the finger touches the fingerprint sensor in this way, electrostatic charging can easily occur. The subsequent discharge or the resultant overvoltages can cause the operation of the fingerprint sensor to be impaired or can even cause the fingerprint sensor to be destroyed. To prevent the electrostatic discharge, it is not acceptable, in normal use of a fingerprint sensor, for the finger to have to be grounded in order to discharge it before contact with the fingerprint sensor. For this reason, protection against ESD is frequently ensured for the fingerprint sensor by situating a tungsten protective grating above the sensor electrode matrix. By way of example, this protective measure is described in Published German Patent application DE 199 01 384 A1, which corresponds to U.S. patent application Ser. No. US2002/0066942. U.S. patent application Ser. No. US2002/0066942 is hereby incorporated by reference. A drawback of a tungsten protective grating is that it reduces the sensitivity of the fingerprint sensor, because some of the electrical field lines running from the sensor electrodes to the contact surface are deflected by the tungsten protective grating. The sensitivity E of a fingerprint sensor is defined by the following equation:

$$E = \frac{C_{useful}}{C_{stray}}, \quad (1)$$

where $C_{useful}$ is the useful capacitance between the sensor electrodes and the finger, and $C_{stray}$ denotes the undesirable stray capacitance. The stray capacitance $C_{stray}$ covers the capacitance between the sensor electrodes and the protective grating.

Sensitivity is a fundamental quality feature of a fingerprint sensor. Only if sensitivity is sufficient is it possible to record the diverse characteristics of a fingerprint.

SUMMARY OF THE INVENTION

It is accordingly an object of the invention to provide a fingerprint sensor, a fingerprint sensor circuit, and a method for optimizing the sensitivity of a fingerprint sensor, which overcome the above-mentioned disadvantages of the prior art apparatus and methods of this general type.

In particular, it is an object of the invention to protect a capacitive fingerprint sensor against ESD in a way that does not substantially reduce the sensitivity of the fingerprint sensor.

An inventive fingerprint sensor has a plurality of sensor electrodes that can be used to record a fingerprint. The sensor electrodes are mounted below a contact surface, which is intended for contacting the underside of a finger, of the fingerprint sensor. The fingerprint sensor also has at least one protective electrode which can be situated either on or in the contact surface and which incompletely covers at least the sensor electrodes. The function of the protective electrode(s) is to ensure protection against ESD and protection against overvoltages for the fingerprint sensor. The sensor electrodes can have a first AC voltage applied to them. The first AC voltage is at a prescribed frequency. The first AC voltage produces a voltage between the sensor electrodes and the underside of the finger, which voltage is required for reading the capacitances produced by the sensor electrodes and the underside of the finger. The protective electrode can have a second AC voltage applied to it. The second AC voltage is essentially at the prescribed frequency.

Experiments have shown that modulating the protective electrode(s) with the second AC voltage, which is essentially at the frequency of the first AC voltage, reduces the influence of the protective electrode on the sensitivity of the fingerprint sensor. The sensitivity can even be increased, for example, by varying the amplitude of the second AC voltage, to such an extent that the fingerprint sensor with the protective electrode has the same sensitivity as there would be in a fingerprint sensor of the same design without a protective electrode. Applying the second AC voltage to the protective electrode supplies additional energy to the capacitive system including the sensor electrodes and the finger, which explains the compensation for the sensitivity losses. This measure results in the same effect that would be achieved by increasing the ratio of the useful capacitance to the stray capacitance in accordance with equation (1). Any design improvement for an evaluation circuit connected downstream of the fingerprint sensor (which design improvement is frequently required in order to compensate for the sensitivity losses as a result of protection against ESD) can be obviated by the inventive fingerprint sensor.

The protective electrode is advantageously in the form of a grating-like or grid-like or strip-like area. This measure makes it possible to achieve optimum protection against ESD for the fingerprint sensor using just one protective electrode if the protective electrode is of suitable design and if the sensor electrodes are suitably arranged. For this purpose, it is necessary to ensure that, for all three forms, parts of the protective electrode(s) are sufficiently close to the sensor electrodes.

In accordance with another advantageous refinement of the invention, the amplitudes of the first and second AC voltages can be set. Suitably varying the amplitude of the second AC voltage increases the sensitivity of the fingerprint sensor. In particular, the amplitude of the second AC voltage can be greater than the amplitude of the first AC voltage. In addition, the amplitude of the second AC voltage can advantageously be greater than the supply voltage used to operate the fingerprint sensor. This measure makes it possible to achieve greater sensitivity for the fingerprint sensor than would be possible without the protection against ESD.

In another advantageous refinement of the invention, the phases of the first and second AC voltages can be set. Experiments have shown that the sensitivity of the fingerprint sensor can be significantly increased when there is a suitable difference between the phases of the first and second AC voltages.

The inventive method specifies the necessary step for optimizing the sensitivity of a capacitive fingerprint sensor having the features described above. To this end, the amplitude and/or the phase of the second AC voltage is set such that the sensitivity of the fingerprint sensor assumes a maximum value. It has already been explained above that such variation of the amplitude and/or phase of the second AC voltages allows the sensitivity of the fingerprint sensor to be increased beyond the sensitivity of a fingerprint sensor without a protective electrode. In the case of the inventive method, the sensitivity can be determined, by way of example, by the local resolution capacity of the fingerprint sensor. This method represents a technically very easily implemented way of compensating for the sensitivity losses caused by the protection against ESD in a fingerprint sensor with protection against ESD.

Other features which are considered as characteristic for the invention are set forth in the appended claims.

Although the invention is illustrated and described herein as embodied in a fingerprint sensor with potential modulation of the ESD protective grating, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
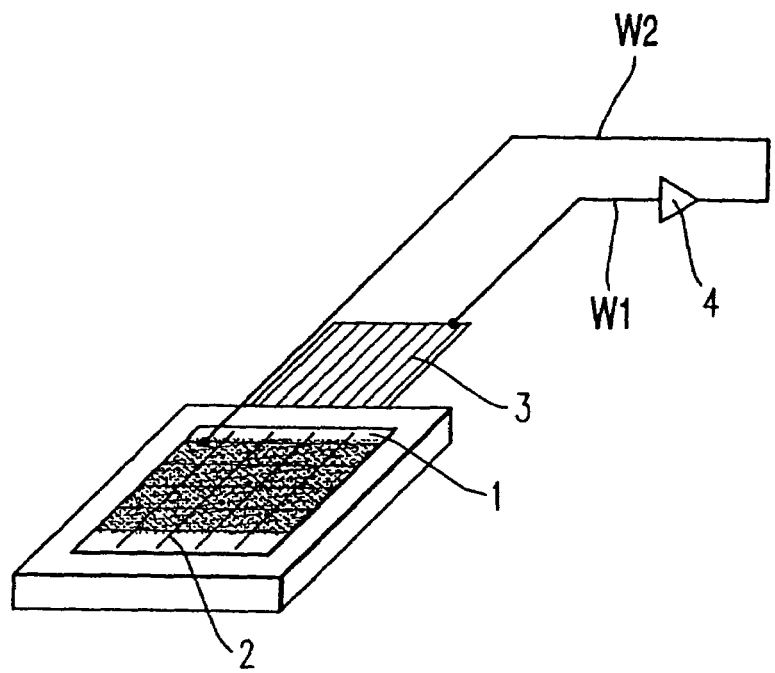
FIG. 1A is a schematic illustration of an exemplary embodiment of the inventive fingerprint sensor.

Referring now to the figures of the drawing in detail and first, particularly, to FIG. 1A thereof, there is shown a capacitive fingerprint sensor 1 having a surface for contacting the underside of a finger that is to be recorded. Mounted on this surface is a protective grating 2 for protection against ESD. A ribbon cable 3 is used to actuate the fingerprint sensor 1 with an AC voltage W1 and other signals in order to record the fingerprint, and at the same time to forward the signals recorded by the fingerprint sensor 1 to an evaluation unit connected downstream. In addition, the AC voltage W1 is routed out of the ribbon cable 3 through a branch using the internal clock of the fingerprint sensor 1 and is supplied to a controllable amplifier 4. On the amplifier 4, the amplitude and phase of the AC voltage W2 output by the amplifier 4 can be set. The frequency of the AC voltage W1 is not altered by the amplifier 4. The AC voltage W2 is applied to the protective grating 2 mounted on the fingerprint sensor 1. Suitably setting the amplitude and phase of the AC voltage W2 allows the sensitivity of the fingerprint sensor 1 to be optimized.

Figure 1B:
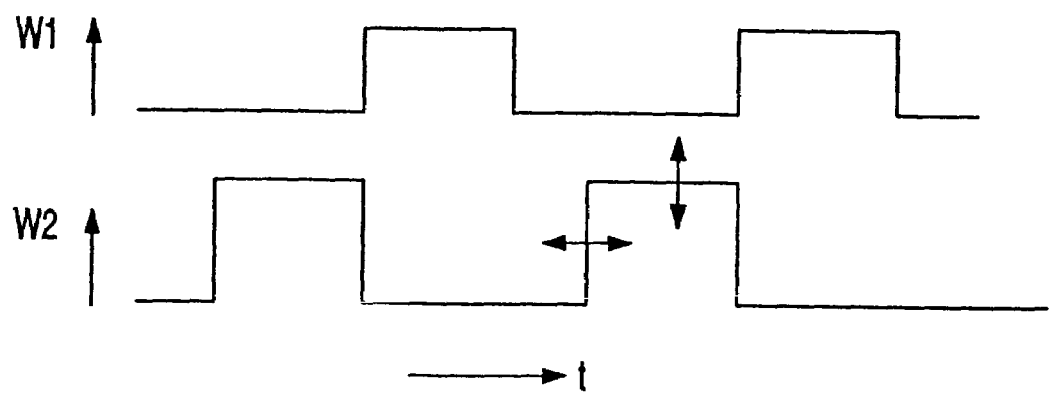
FIG. 1B is a schematic illustration of the amplitude and phase variation of the second AC voltage.

FIG. 1B shows schematic diagrams of the AC voltages W1 and W2 as a function of time t. In FIG. 1B, the AC voltages W1 and W2 are characterized by square-wave pulses. In this case, the AC voltages W1 and W2 have matching pulse periods and intervals between successive pulses, i.e. the AC voltages W1 and W2 are at equal frequencies. However, the AC voltages W1 and W2 differ in terms of the amplitudes and phases of the pulses.

We claim:
1. A fingerprint sensor, comprising:
    a contact surface for contacting an underside of a finger and for recording a fingerprint of the finger;
    a plurality of sensor electrodes mounted below said contact surface; and
    at least one protective electrode mounted on or in said contact surface, said protective electrode incompletely covering said plurality of sensor electrodes;
    said plurality of sensor electrodes having a first AC voltage being applied at a prescribed freguency;
    said protective electrode having a second AC voltage being substantially applied at the prescribed frequency;
    the second AC voltage having an amplitude being greater than a supply voltage for the fingerprint sensor.
2. The fingerprint sensor according to claim 1, wherein said protective electrode is formed as a grating, a grid, or a strip.
3. The fingerprint sensor according to claim 1, wherein:
    the first AC voltage has a settable amplitude and the amplitude of the second AC voltage is settable; and
    the amplitude of the second AC voltage is greater than the amplitude of the first AC voltage.
4. A method for optimizing the sensitivity of a fingerprint sensor, which comprises;
    providing the fingerprint sensor according to claim 1;
    setting at least one of the amplitude of the second AC voltage and a phase of the second AC voltage such that a sensitivity of the fingerprint sensor assumes a maximum value and the sensitivity is determined by a local resolution of the fingerprint sensor.

5. A fingerprint sensor, comprising:
a contact surface for contacting an underside of a finger and for recording a fingerprint of the finger;
a plurality of sensor electrodes mounted below said contact surface; and
at least one protective electrode mounted on or in said contact surface, said protective electrode incompletely covering said plurality of sensor electrodes;
said plurality of sensor electrodes having a first AC voltage being applied at a prescribed frequency;
said protective electrode having a second AC voltage being substantially applied at the prescribed frequency;
the first AC voltage having a settable phase and the second AC voltage having a settable phase;
the first AC voltage having a settable amplitude and the second AC voltage haing a settable amplitude;
the amplitude of the second AC voltage being greater than the amplitude of the first AC voltage.

6. The fingerprint sensor according to claim 5, wherein said protective electrode is formed as a grating, a grid, or a strip.

7. A method for optimizing the sensitivity of a fingerprint sensor, which comprises:
providing the fingerprint sensor according to claim 5;
setting at least one of an amplitude of the second AC voltage and a phase of the second AC voltage such that a sensitivity of the fingerprint sensor assumes a maximum value and the sensitivity is determined by a local resolution of the fingerprint sensor.

8. A fingerprint sensor circuit, comprising:
a fingerprint sensor including a contact surface for contacting an underside of a finger and for recording a fingerprint of the finger, a plurality of sensor electrodes mounted below said contact surface, and at least one protective electrode mounted on or in said contact surface, said protective electrode incompletely covering said plurality of sensor electrodes;
a first AC voltage at a prescribed frequency being applied to said plurality of sensor electrodes;
a second AC voltage essentially at the prescribed frequency being applied to said protective electrode; and
a supply voltage for the fingerprint sensor;
the second AC voltage having an amplitude being greater than the supply voltage.

9. The fingerprint sensor circuit according to claim 8, wherein said protective electrode is formed as a grating, a grid, or a strip.

10. The fingerprint sensor circuit according to claim 8, wherein:
the first AC voltage has a settable amplitude and the amplitude of the second AC voltage is settable; and
the amplitude of the second AC voltage is greater than the amplitude of the first AC voltage.

11. A method for optimizing the sensitivity of a fingerprint sensor, which comprises:
providing the fingerprint sensor circuit according to claim 8;
setting at least one of the amplitude of the second AC voltage and a phase of the second AC voltage such that a sensitivity of the fingerprint sensor assumes a maximum value and the sensitivity is determined by a local resolution of the fingerprint sensor.

12. A fingerprint sensor circuit, comprising:
a fingerprint sensor including a contact surface for contacting an underside of a finger and for recording a fingerprint of the finger, a plurality of sensor electrodes mounted below said contact surface, and at least one protective electrode mounted on or in said contact surface, said protective electrode incompletely covering said plurality of sensor electrodes;
a first AC voltage at a prescribed frequency being applied to said plurality of sensor electrodes; and
a second AC voltage essentially at the prescribed frequency being applied to said protective electrode;
the first AC voltage having a settable phase and the second AC voltage having a settable phase;
the first AC voltage having a settable amplitude and the second AC voltage having a settable amplitude;
the amplitude of the second AC voltage being greater than the amplitude of the first AC voltage.

13. The fingerprint sensor circuit according to claim 12, wherein said protective electrode is formed as a grating, a grid, or a strip.

14. A method for optimizing the sensitivity of a fingerprint sensor, which comprises:
providing the fingerprint sensor according to claim 12;
setting at least one of an amplitude of the second AC voltage and a phase of the second AC voltage such that a sensitivity of the fingerprint sensor assumes a maximum value and the sensitivity is determined by a local resolution of the fingerprint sensor.

* * * * *